(12) United States Patent
Lundberg

(10) Patent No.: US 6,707,345 B2
(45) Date of Patent: Mar. 16, 2004

(54) OSCILLATOR FREQUENCY VARIATION MECHANISM

(75) Inventor: James R. Lundberg, Austin, TX (US)

(73) Assignee: IP-First, LLC, Fremont, CA (US)

( * ) Notice: Subject to any disclaimer, the term of this patent is extended or adjusted under 35 U.S.C. 154(b) by 0 days.

(21) Appl. No.: 10/046,057

(22) Filed: Jan. 14, 2002

(65) Prior Publication Data

US 2003/0132808 A1 Jul. 17, 2003

(51) Int. Cl.[7] .............................................. H03B 29/00
(52) U.S. Cl. ............................ 331/78; 331/46; 331/49; 331/55
(58) Field of Search .............................. 331/78, 46, 55, 331/49; 327/164

(56) References Cited

U.S. PATENT DOCUMENTS

| | | | |
|---|---|---|---|
| 4,799,259 A | * | 1/1989 | Ogrodski ..................... 331/78 |
| 5,864,491 A | | 1/1999 | Smeets |
| 6,034,667 A | | 3/2000 | Barrett |
| 6,369,727 B1 | | 4/2002 | Vincze |

FOREIGN PATENT DOCUMENTS

JP   2002323971   * 11/2002

OTHER PUBLICATIONS

Bernstein et al. "Secure Random Number Generation Using Chaotic Circuits" 1989 IEEE Military Communications Conference Oct. 15–18, 1989 vol. 3 pp 640–644.*

* cited by examiner

Primary Examiner—Michael B. Shingleton
(74) Attorney, Agent, or Firm—Richard K. Huffman; James W. Huffman

(57) ABSTRACT

A frequency variation apparatus is provided for use in a hardware-based random number generator. The frequency variation apparatus includes sampling frequency variation logic and a sampling frequency oscillator. The sampling frequency variation logic produces a noise signal that corresponds to parity of two independent and asynchronous oscillatory signals. The sampling frequency oscillator is coupled to the sampling frequency variation logic. The sampling frequency oscillator receives the noise signal, and varies a sampling frequency within the random number generator in accordance with the noise signal.

25 Claims, 7 Drawing Sheets

Variable Bias Control of Oscillators

Device-Based Variable Bias Generator

Slow Frequency Variation Logic

FIG. 10

*Fast Oscillator Frequency*  ⟵ 1000

| XRAY[2:0] | BIAS (mv) | SOS_PERIOD (ns) | SOS_FREQUENCY (MHz) |
|---|---|---|---|
| 100 | 766 | 2.00 | 500 |
| 101 | 750 | 1.88 | 532 |
| 110 | 736 | 1.80 | 556 |
| 111 | 717 | 1.70 | 588 |
| 000 | 694 | 1.61 | 621 |
| 001 | 668 | 1.46 | 685 |
| 010 | 594 | 1.30 | 769 |
| 011 | 509 | 1.15 | 870 |

FIG. 11

*Slow Oscillator Frequency*  ⟵ 1100

| XRAY[2:0] | BIAS (mv) | NOISE = 0 | | NOISE = 1 | |
|---|---|---|---|---|---|
| | | BOS PERIOD (ns) | BOS FREQUENCY (MHz) | BOS PERIOD (ns) | BOS FREQUENCY (MHz) |
| 100 | 766 | 20.0 | 50 | 46.0 | 22 |
| 101 | 750 | 19.0 | 53 | 44.0 | 23 |
| 110 | 736 | 18.0 | 56 | 42.8 | 23 |
| 111 | 717 | 17.3 | 58 | 33.5 | 30 |
| 000 | 694 | 17.0 | 59 | 31.9 | 31 |
| 001 | 668 | 16.4 | 61 | 31.0 | 32 |
| 010 | 594 | 16.1 | 62 | 28.0 | 36 |
| 011 | 509 | 15.8 | 63 | 25.8 | 39 |

OSCILLATOR FREQUENCY VARIATION MECHANISM

CROSS-REFERENCE TO RELATED APPLICATIONS

This application is related to the following U.S. patent applications, which are filed on the same day as this application, and which have a common assignee and common inventors.

| SERIAL NUMBER | TITLE |
| --- | --- |
| 10/046,055 | APPARATUS for GENERATING RANDOM NUMBERS |
| 10/046,054 | OSCILLATOR BIAS VARIATION MECHANISM |

BACKGROUND OF THE INVENTION

1. Field of the Invention

This invention relates in general to the field of microelectronics, and more particularly to a mechanism for randomly varying the frequency of an oscillator that is employed within an integrated circuit random number generator.

2. Description of the Related Art

Many present day computer-based applications rely heavily on the availability of random numbers. What has historically been the province of scientific programmers has more recently crept over into the commercial realm.

In prior years, large and powerful computing systems utilized random numbers for use within simulation programs to realistically model stochastic properties of phenomena of interest, such as the flow of traffic within a large network of computers.

And while the requirement for efficient and convenient generation of random numbers has not declined with respect to the modeling and simulation areas, because technological advances have provided more computing power to desktop computers in more recent years, such requirements have been imposed on the elements of desktop computers themselves. In fact, processing power increases in desktop computing have given rise to entirely new application areas that depend upon the generation of random numbers. For instance, random numbers are now widely used within many computer games to locate, say, asteroids or enemy fighters. To be acceptable to the consumer as a credible representation of reality, computer games must simulate their corresponding phenomena of interest in the same probabilistic fashion as one would expect such phenomena to occur in real life.

Another application area that depends upon the availability of random numbers is cryptography, an area that continues to provide very demanding criteria for random number generation. Within this field, random numbers are employed as cryptographic keys that are used by algorithms to encrypt and decrypt electronic files or streams of data for storage or transmission. For example, random keys are generated to encrypt financial data as secure electronic transactions are processed over the Internet. Remarkably, it is becoming more and more commonplace to find that ordinary electronic mail messages and the like are being encrypted for transmission between parties.

At present, most of the random number generation within desktop computing systems is accomplished within an application program. This form of generation is known as pseudo-random number generation because generation of the numbers employs a mathematical algorithm to produce a sequence of independent numbers that comport with a uniform probability distribution. Typically, a "seed" number is initially selected, then the algorithm proceeds to crank out numbers that appear to be random, but that are entirely deterministic in nature given knowledge of the seed. To be truly random, a random number generator must be based upon random attributes of some physical devices, such as the thermal noise generated across a diode or resistor.

Some hardware-based random number generators are available as separate integrated circuits, but to date, no hardware technique or approach exists that lends itself to incorporation within a microprocessor circuit. And since a microprocessor is the heart of any desktop computing system, it is advantageous for random numbers to be generated directly within the microprocessor itself.

Therefore, what is needed is a hardware-based random number generator that is easily incorporated into an integrated circuit design, and in particular, into the design of a present day microprocessor.

In addition, what is needed is a random number generation apparatus that utilizes logic elements which are common to those used within a microprocessor integrated circuit.

SUMMARY OF THE INVENTION

The present invention provides a superior technique hardware-based random number generation. In one embodiment, a frequency variation apparatus is provided for use in a random number generator. The frequency variation apparatus includes sampling frequency variation logic and a sampling frequency oscillator. The sampling frequency variation logic produces a noise signal that corresponds to parity of two independent and asynchronous oscillatory signals. The sampling frequency oscillator is coupled to the sampling frequency variation logic. The sampling frequency oscillator receives the noise signal, and varies a sampling frequency within the random number generator in accordance with the noise signal.

One aspect of the present invention contemplates a random number generation apparatus for use within an integrated circuit. The random number generation apparatus has a fast oscillator, a slow oscillator, and frequency variation logic. The fast oscillator generates a fast oscillatory signal at a first frequency. The slow oscillator generates a slow oscillatory signal at a second frequency, where the slow oscillatory signal is employed to take samples of the fast oscillatory signal to produce bits for a random number, and where the slow oscillator varies the second frequency according to a noise signal. The frequency variation logic is coupled to the slow oscillator. The frequency variation logic generates the noise signal, where the noise signal varies according to parity of two independent oscillatory signals.

Another aspect of the present invention comprehends a bit generation mechanism, for use in a random number generator. The bit generation mechanism includes a first oscillatory signal, a second oscillatory signal, synchronization logic, third and fourth oscillatory signals, and parity logic. The first oscillatory signal is generated by a first oscillator, and oscillates at a first frequency. The second oscillatory signal is generated by a second oscillator, and oscillates at a second frequency. The said second frequency varies according to a noise signal. The synchronization logic is coupled to the first and second oscillatory signals. The synchronization logic serially generates bits for a random number at a rate proportional to the second frequency. The third and fourth oscillatory signals independently oscillate at third and fourth frequencies. The parity logic is coupled to the third and fourth oscillatory signals. The parity logic generates the noise signal based upon parity of the third and fourth oscillatory signals.

BRIEF DESCRIPTION OF THE DRAWINGS

These and other objects, features, and advantages of the present invention will become better understood with regard to the following description, and accompanying drawings where:

FIG. 10 is a table showing periods and frequencies for an exemplary fast oscillatory signal as a function of several levels of an analog bias signal; and FIG. 11 is a table showing periods and frequencies for an exemplary slow oscillatory signal as a function of several levels of an analog bias signal for different logic states of a randomly varying noise bit.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

In view of the above background discussion on random number generation and associated techniques employed within present day integrated circuits for the generation of random numbers, a discussion of the present invention will now be presented with reference to FIGS. 1–11.

Figure 1:
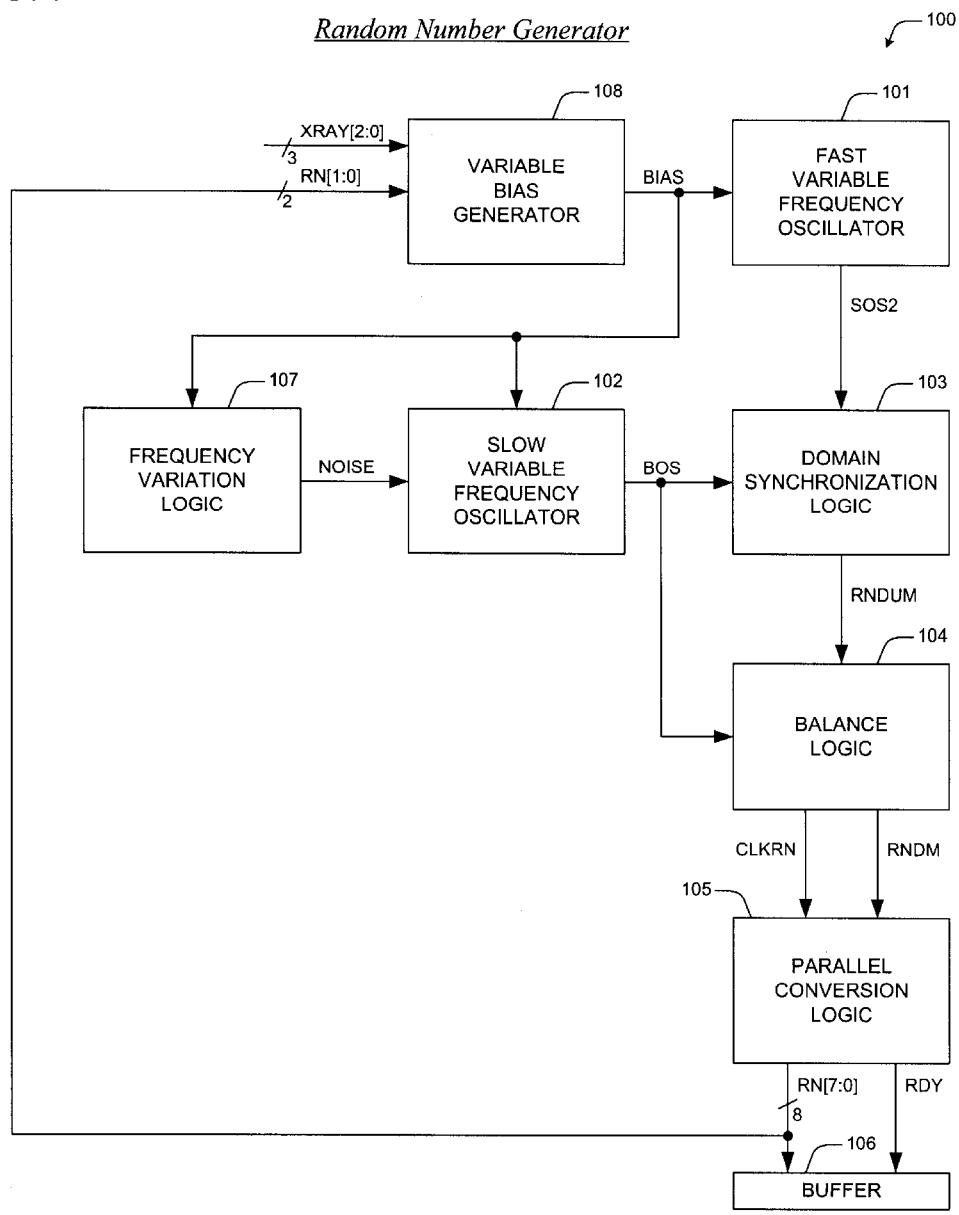
FIG. 1 is a block diagram illustrating an apparatus for generating random numbers according to the present invention.

Turning to FIG. 1, a block diagram is presented illustrating an apparatus for generating random numbers 100 according to the present invention. The apparatus 100 has a fast variable frequency oscillator 101 that generates a fast oscillatory signal SOS2. The fast oscillatory signal SOS2 is provided to domain synchronization logic 103. The random number apparatus 100 also has a slow variable frequency oscillator 102 that generates a slow oscillatory signal BOS, which is routed to the domain synchronization logic 103 and to balance logic 104. The apparatus 100, or random number generator 100, additionally has a variable bias generator 108 that generates a randomly varying analog bias signal BIAS, which is provided to both variable frequency oscillators 101, 102, and to frequency variation logic 107. The frequency variation logic 107 produces a digital noise signal NOISE that is provided to the slow variable frequency oscillator 102. The balance logic 104 outputs a random bit signal RNDM, along with a random bit strobe signal CLKRN to parallel conversion logic 105. The parallel conversion logic 105 outputs a random number bus RN[7:0] along with a ready signal RDY to a buffer 106. A plurality of bits RN[1:0] from the random number bus RN[7:0] are routed back to the variable bias generator 108.

In one embodiment, the fast oscillator 101 and the slow oscillator 102 are both configured as ring oscillators 101, 102, such as are commonly employed as clock signal generators 101, 102 in a present day integrated circuit. One skilled in the art will appreciate that a typical ring oscillator 101, 102 provides an oscillatory output signal SOS2, BOS within a frequency range whose bounds are determined by component selection and sizing within the oscillator 101, 102 itself. The specific frequency of the oscillatory signal SOS2, BOS is generally set according to the amplitude of an analog bias signal BIAS that is provided to the oscillator 101, 102 from an external source 108. In many applications, a specific ring oscillator 101, 102 is selected within whose range of output frequencies a particular output frequency is desired, and a bias signal BIAS is then employed to finely tune the particular output to the desired output frequency. In addition to providing fine control over the frequency of a desired output, today's microelectronics utilize various other techniques to slightly vary the value of a bias signal BIAS in order to provide compensation for voltage and temperature fluctuations within a system, and to compensate for integrated circuit fabrication process variations.

In operation, although a common bias signal BIAS is provided to both the fast oscillator 101 and the slow oscillator 102, they generate independent and asynchronous outputs SOS2, BOS. In one embodiment, the oscillators 101, 102 are selected such that the fast oscillator 101 produces a range of frequencies that is between 10 and 20 times that produced by the slow oscillator 102. In an alternative embodiment, the range of frequencies provided by the fast oscillator 101 is at least two times that provided by the slow oscillator 102. The domain synchronization logic 103 uses the slow oscillatory signal BOS as a sampling clock BOS to obtain samples of the fast oscillatory signal SOS2. The samples of the fast oscillatory signal SOS2, taken at the frequency of the slow oscillatory signal BOS, are sequentially provided to the random bit signal RNDUM as potential bits for a random number.

The balance logic 104 is provided to compensate for process variations or any other types of variations that could result in the generation of potential random number bits on signal RNDUM having a bias towards a particular logic state (i.e., logic 0 or logic 1). Accordingly, the balance logic 104 examines successive pairs of potential random number bits provided via RNDUM to determine whether the two members of each pair have the same logic state. If both member bits within a given pair are of the same logic state, then the balance logic 104 rejects the pair as bits for the random number. If both member bits have different logic states, then the balance logic selects one of the member bits as a bit for the random number. In one embodiment, the first of the two member bits within a pair or potential bits is selected as the random number bit. In an alternative embodiment, the second of the two member bits is selected. Following selection, the random number bit is routed to the random number bit output RNDM and a corresponding strobe CLKRN is generated by the balance logic 104 to indicate to the parallel conversion logic that another random number bit is available.

Bits of the random number are serially clocked into the parallel conversion logic 105 via signals RNDM and CLKRN. The parallel conversion logic 105 aggregates serially generated random number bits into an n-bit random number that is provided in parallel to a buffer 106 via bus RN[7:0]. A ready signal RDY enables the buffer 106 to latch the n-bit random number so that it can be subsequently retrieved. In one embodiment, an 8-bit random number is provided over the bus RN[7:0]. Alternative embodiments, however, can provide random numbers having alternative structures that are commensurate with the requirements of alternative applications.

Randomness of the potential bits for use in a random number is enhanced through independently varying the frequencies of both the fast and slow oscillators 101, 102. First, the level of the bias signal BIAS to both oscillators 101, 102 is varied in accordance with the logic states of a plurality of bits of the random number as the random number is being configured for presentation to the buffer 106. As the parallel conversion logic 105 continuously shifts serial random number bits into parallel random numbers, the state of bus RN[7:0] changes to reflect the logic state of each new bit that is shifted into a new bit position. One embodiment of the present invention picks off two of the bits RN[1:0] from the bus RN[7:0], and routes these bits RN[1:0] to the variable bias generator 108. The bias generator 108, in turn, varies the analog value of BIAS according to the state of these two bits RN[1:0]. The variation of signal BIAS is around a fixed value of BIAS that is determined by the state of a 3-bit fixed-point input XRAY[2:0]. In an integrated circuit embodiment, the state of the fixed-point input XRAY[2:0] is permanently established during fabrication of the part. Hence, the fixed-point input XRAY[2:0] enables an integrated circuit designer to adjust the value of the bias signal BIAS during production of a part to compensate for variations in process. Although the embodiment illustrated in FIG. 1 employs only two bits RN[1:0] from the random number bus RN[7:0] to modulate the bias signal BIAS, one skilled in the art will discern that different embodiments of the present invention can be configured to pick off other bits of bus RN[7:0] in order to satisfy the requirements of alternative applications.

A second mechanism that enhances the randomness of the potential bits is provided through the frequency variation logic 107. The frequency variation logic 107 independently generates digital noise signal NOISE whose logic state randomly varies the frequency of the slow variable frequency oscillator 102. The noise signal NOISE is employed in conjunction with the bias signal BIAS by the slow oscillator 102, to change the frequency of the oscillatory signal BOS, thus effectively altering the sampling frequency of signal SOS2.

To summarize the random number generation apparatus 100 according to the present invention, the output state SOS2 of a first oscillator 101 is sampled at a rate established by a second oscillator 102. The second oscillator 102 has a frequency that is less than the first oscillator 101. Balance logic 104 filters out pairs of samples that have the same logic level. One bit from each accepted pair is used to configure an n-bit random number, which is provided to a buffer 106 upon completion of serial-to-parallel conversion. A plurality of bits RN[1:0] of the random number, as it is being configured, is employed by a bias generator 108 to continuously vary the level of a bias signal BIAS that is provided to both the first and second oscillators 101, 102, thus continuously varying the frequencies of their corresponding outputs SOS2, BOS. The frequency of the second, slower oscillator 102 is additionally varied continuously in based upon the logic state of an independently generated, random digital signal NOISE.

Figure 2:
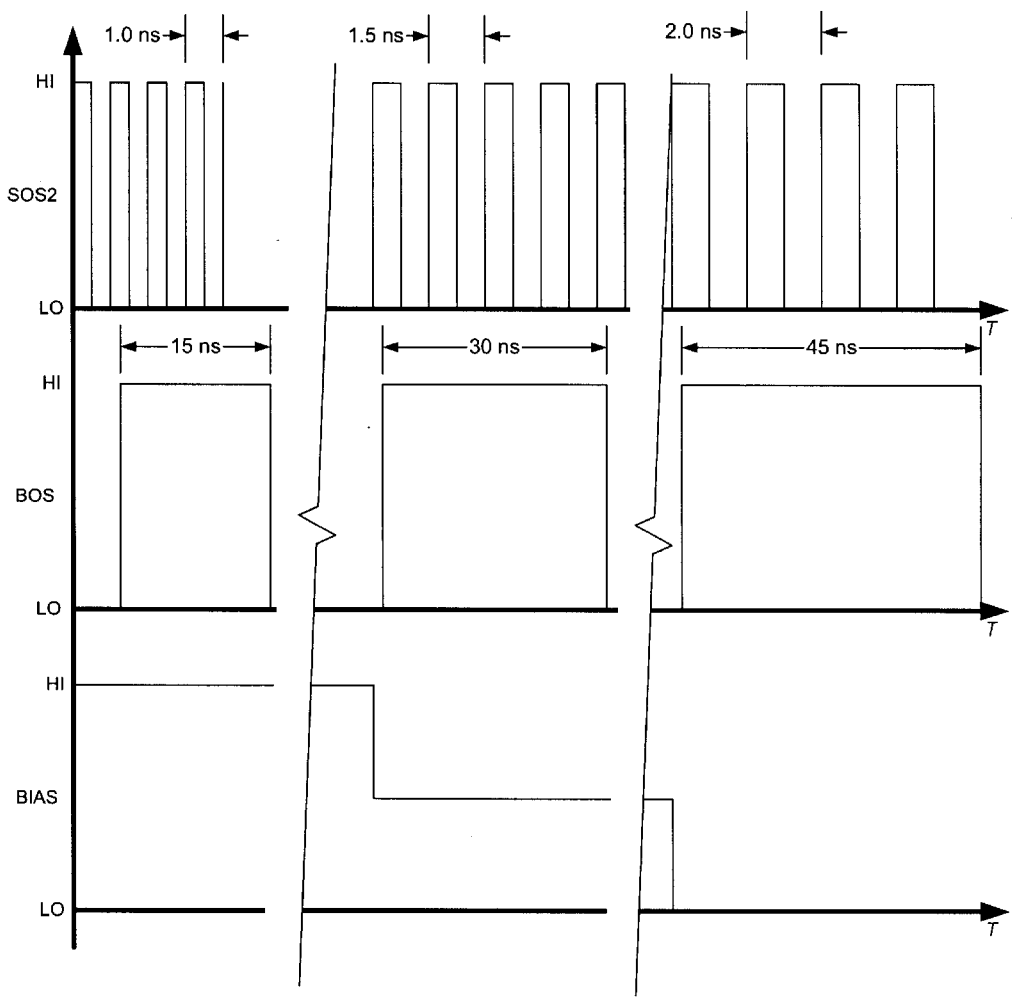
FIG. 2 is a timing diagram depicting how variable bias control is employed according to the present invention to modify oscillator frequencies.

Now turning to FIG. 2, a timing diagram 200 is presented depicting how variable bias control is employed according to the present invention to modify oscillator frequencies. The timing diagram 200 shows a first oscillatory signal SOS, a second oscillatory signal BOS, and a variable analog bias signal BIAS. The signals SOS2, BOS, BIAS are representative of those like-named outputs discussed with reference to FIG. 1. The amplitudes of each of the signals SOS2, BOS, BIAS are depicted with respect to amplitude boundaries HI, LO, which represent voltage boundaries achievable within a present day microcircuit according to the provided supply voltage and circuit technology employed for the microcircuit. For example, within a 1.5-volt technology CMOS integrated circuit, the voltage represented by HI is roughly 1.5 volts and the voltage represented by LO is roughly 0 volts.

According to a representative embodiment of the present invention, when signal BIAS is at extreme HI, both oscillatory outputs SOS2, BOS are at their highest frequency. Signal SOS2 has a 1.0 ns period, corresponding to a frequency of 1 GHz. Signal BOS has a 15 ns period, corresponding to a sampling frequency of 67 MHz. Hence, at extreme HI for the bias signal BIAS, signal SOS2 is approximately 15 times faster that sampling signal BOS.

When the bias signal BIAS is at extreme LO, both oscillatory outputs SOS2, BOS are at their lowest frequency. Signal SOS2 has a 2.0 ns period, corresponding to a frequency of 500 MHz. Signal BOS has a 45 ns period, corresponding to a sampling frequency of approximately 22 MHz. At this extreme, the sampling frequency, given by BOS, is approximately 22 times slower than the potential bit generation frequency, given by SOS2.

A midrange amplitude of BIAS results in signal SOS2 having a 1.5 ns period (667 MHz) and signal BOS having a 30 ns period (33 MHz). At the midrange, the sampling frequency is approximately 20 times slower than the potential bit generation frequency.

The timing diagram 200 of FIG. 2 is presented to clarify that, even in the presence of an approximately linear response in period of each oscillatory signal SOS2, BOS to variation of the bias signal BIAS, the frequency relationship between the two oscillatory signals SOS2, BOS varies non-linearly. One skilled in the art will appreciate from the timing diagram 200 in view of the above discussion that embodiments of the present invention do not require linear responses of any of the oscillators within the apparatus, nor is the bias signal BIAS required to vary over the full range of a provided supply voltage to a system or integrated circuit that incorporates the present invention. Nor is it required that the fast oscillatory signal SOS2 be approximately from 10 to 20 times faster than the sampling signal BOS.

Figure 3:
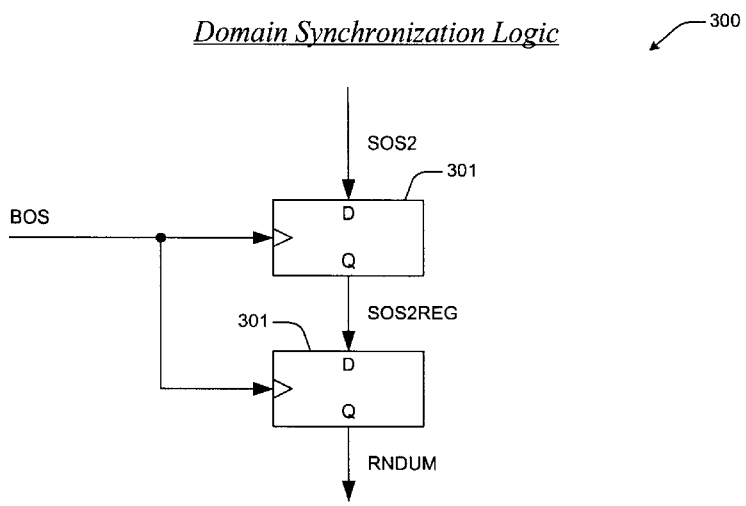
FIG. 3 is a block diagram featuring domain synchronization logic within the random number generator of FIG. 1.

Referring now to FIG. 3, a block diagram is presented featuring domain synchronization logic 300 within the random number generator 100 of FIG. 1. The domain synchronization logic 300 includes two registers 301 through which a fast oscillatory signal SOS2 is synchronized (i.e., sampled) into the time domain corresponding to a slow oscillatory signal BOS. In one embodiment, the registers 301 are D flip-flop circuits 301 and signal BOS is employed as a clock input to both flip-flop circuits 301. A first clocking edge (i.e., rising or falling edge as is determined by specific circuit configuration) of BOS takes a sample of signal SOS2 to produce output SOS2REG. On the next clocking edge of BOS, the second register 301 latches the state of signal SOS2REG to output RNDUM. One skilled in the art will acknowledge that at least two sequential registers 301 are generally used to synchronize digital signals from differing time domains in order to overcome metastability problems associated with the two differing asynchronous time domains. Hence, following a 1-clock startup delay, upon each clocking edge of the slow oscillatory signal BOS, the domain synchronization logic 300 provides a new potential bit for a random number over output RNDUM.

Figure 4:
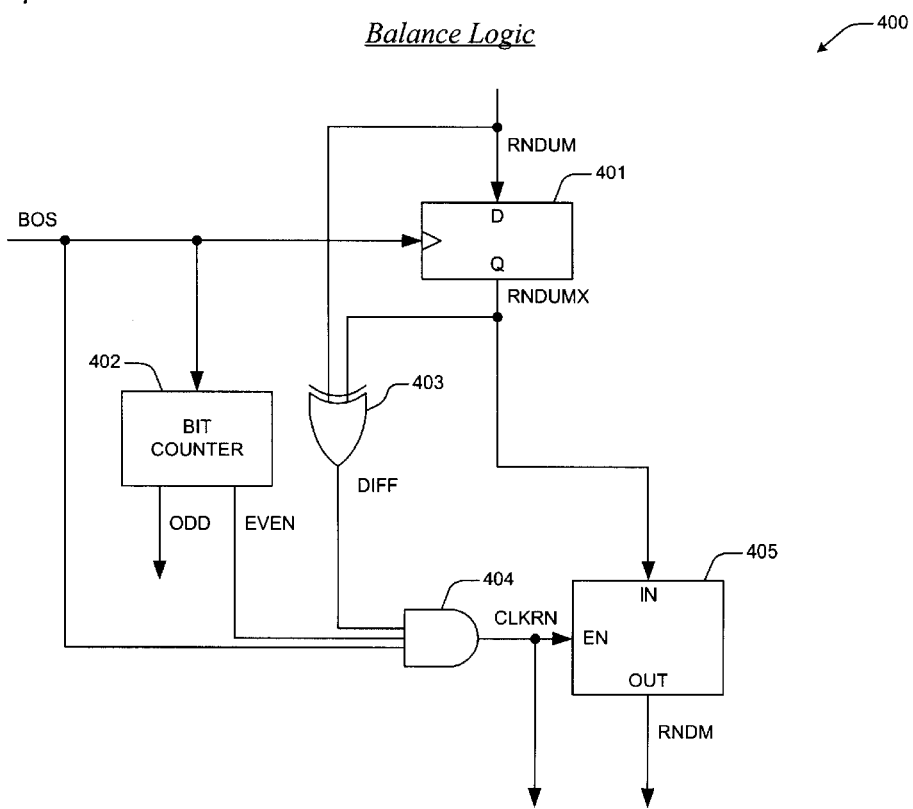
FIG. 4 is a block diagram showing balance logic according to the present invention.

Now turning to FIG. 4, a block diagram is presented showing balance logic 400 according to the present invention. The balance logic 400 has a data register 401 that receives potential bits for a random number via signal RNDUM. The sampling clock BOS is employed as a clock by the data register 401 to clock potential bits sequentially through the balance logic 400. The sampling clock BOS is also provided to a bit counter 402 and to AND logic 404. The data register 401 provides a latched data output RNDUMX that is routed to parity logic 403 and to input IN of a random bit selection buffer 405. The parity logic 403 has an odd parity output DIFF that is provided as an input to the AND logic 404. In addition, an even output EVEN of the bit counter 402 is provided to another input of the AND logic 404.

In operation, the data register 401 enables the balance logic 400 to access a pair of potential bits for the random number that have been sequentially provided by domain synchronization logic 300 as samples of the fast oscillatory signal SOS2 within the time domain of the slow oscillatory signal BOS. Signal RNDUM provides access to a first potential bit and signal RNDUMX provides access to a second potential bit. Both the first and second potential bits within the pair are provided to the parity logic 403. In one embodiment, the parity logic 403 is an exclusive-OR logic gate 403. If the logic states of the potential bits on RNDUM and RNDUMX are different, then the parity logic 403 asserts the odd parity output DIFF. DIFF is not asserted if the two potential bits have the same logic state.

Recall that one object of the balance logic 400 is to examine successive pairs of potential bits that are provided by the domain synchronization logic 300. Hence, the bit counter 402 is employed to assert signal EVEN for every even cycle of BOS and to assert signal ODD for every odd cycle of the sample clock BOS. Accordingly, the even bit output EVEN of the bit counter 402 is used as a qualifier for the AND logic 404 to ensure that potential bits are examined in pairs and that no one potential bit is considered for acceptance more than once. While the parity logic 403 does indeed function as a sliding 2-bit parity window over a stream of potential bits, using the EVEN output as a qualifier for the AND logic 404 ensures that potential bits are treated in pair wise fashion. In one embodiment, the AND logic 404 is an AND logic gate 404.

If the two bits within the pair of potential bits are different states, then the first bit in the pair is routed from signal RNDUMX, through the buffer 405 to output RNDM. Output RNDM is the state of a newly accepted bit for the random number. Accordingly, signal CLKRN is asserted to indicate to subsequent logic that a newly accepted bit is available on RNDM.

Based on the above discussion, one skilled in the art will appreciate that alternative structures are comprehended by the present invention that accomplish the same function as that which has been described. For example, one could just as well employ an odd output ODD of the bit counter 402 as a qualifier for the AND logic 404. Furthermore, the second bit within a pair of potential bits could just as well be accepted as a random number bit rather than the first bit as has been discussed.

Figure 5:
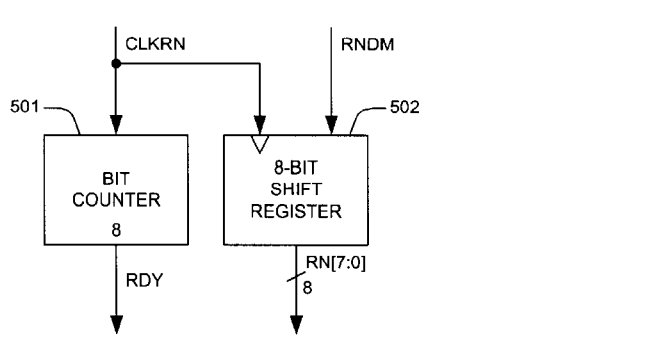
FIG. 5 is a block diagram illustrating parallel conversion logic within the random number generator of FIG. 1.

Referring to FIG. 5, a block diagram is presented illustrating parallel conversion logic 500 within the random number generator of FIG. 1. The parallel conversion logic 500 is coupled to the balance logic 400 and receives signals RNDM and CLKRN. The parallel conversion logic 500 includes a bit counter 501 and a shift register 502.

Operationally, the random number bit strobe signal CLKRN is asserted by the balance logic 400 when a new random number bit has been accepted. Provided via signal RNDM, the new random bit is provided to the shift register 502 and is clocked in via CLKRN. The bit counter 501 counts the number of strobes provided by CLKRN. When CLKRN has been strobed a number of times commensurate with the size of the random number, then the bit counter 501 indicates that a new n-bit random number is available on bus RN[7:0]. In the embodiment illustrated in FIG. 5, an 8-bit counter 501 along with an 8-bit shift register 502 is employed to convert eight sequential random number bits into a parallel 8-bit random number. Although an 8-bit random number is illustrated by the elements of FIG. 5, one skilled in the art will appreciate that other structures are comprehended by the present invention as well in order to provide n-bit random numbers that satisfy the requirements of other applications. In the embodiment shown in FIG. 5, the states of signals on bus RN[7:0] change as new random number bits are shifted through the register 502 and into position on the bus RN[7:0], thus providing a means whereby a plurality of the random number bits from the bus RN[7:0] can be employed by a variable bias generator according to the present invention to vary a bias signal BIAS.

Figure 6:
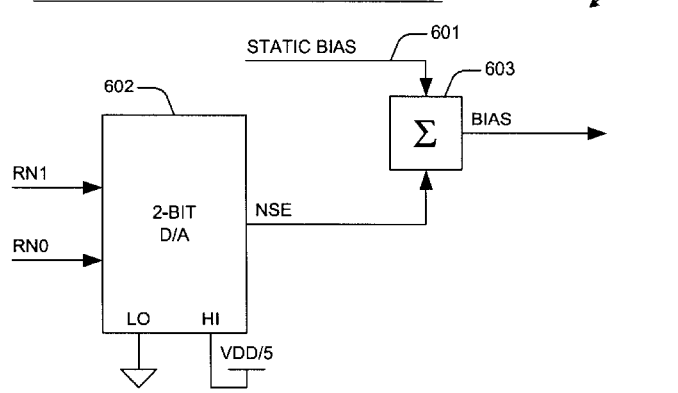
FIG. 6 is a block diagram detailing one embodiment of a variable bias generator according to the present invention.

Turning to FIG. 6, a block diagram is presented detailing one embodiment of a variable bias generator 600 according to the present invention. The variable bias generator 600 includes 2-bit digital-to-analog (D/A) conversion logic 602 and summation logic 603. Two bits RN0, RN1 from the random number bus RN[7:0], as discussed with reference to FIG. 5, are provided as inputs to the 2-bit D/A converter 602.

The 2-bit D/A converts the value of the two digital random number bits RN0, RN1 into an analog voltage signal NSE that varies between a logic zero voltage and 20 percent (i.e., VDD/5) of a supplied power supply voltage (i.e., VDD). For instance, in a 1.5-volt system, if RN0 is 0 and RN1 is 1, then the amplitude of NSE would be approximately 200 mV. When RN0 changes to a logic 1, the value of NSE would become approximately 300 mV.

Since the plurality of bits RN[1:0] of the random number are continuously changing, the value of NSE randomly varies as well. The randomly varying signal NSE is thus summed by the summation logic 603 to the value of a static analog bias signal 601 to produce signal BIAS. The bias signal BIAS is supplied to fast and slow oscillators of the random number generator to randomly vary the random bit generation frequency and the sampling frequency, respectively. In the embodiment shown in FIG. 6, it is anticipated that the amplitude of the static bias signal 601 is established via designer-selected means, such as by establishing the logic levels of signals XRAY[2:0] as shown in FIG. 1. One skilled in the art will appreciate, however, that the intended function of the D/A-based variable bias generator 600 is to render a randomly varying analog voltage NSE to additively modulate a fixed bias 601, resulting in a bias signal BIAS that varies about some fixed voltage point. Accordingly, the LO and HI inputs to the D/A converter 602 and the type of converter itself 602 can be easily modified according to the present invention to accommodate the requirements of alternative embodiments.

Figure 7:
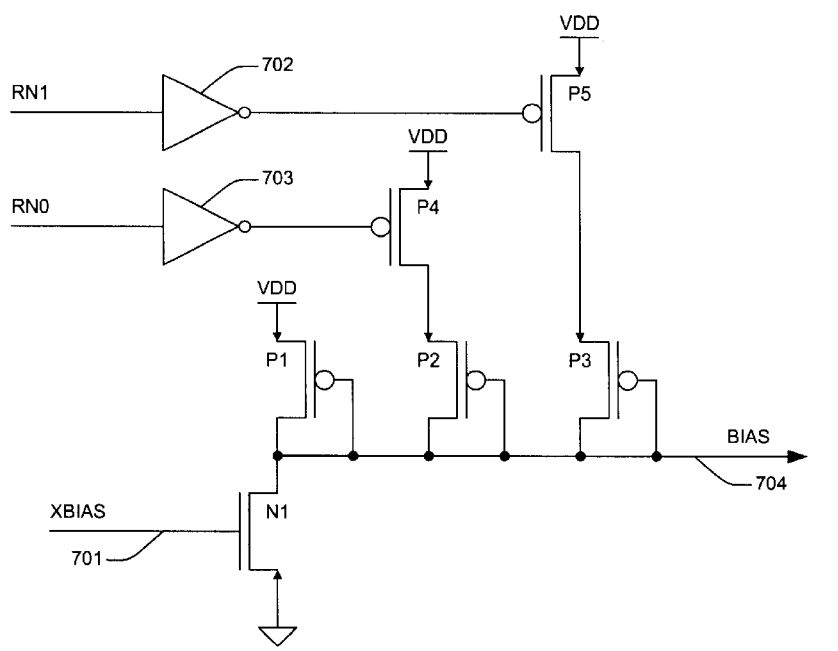
FIG. 7 is a block diagram featuring an alternative embodiment of the variable bias generator.

FIG. 7 shows a block diagram of an alternative embodiment of the variable bias generator 700. The alternative embodiment of the variable bias generator 700 includes three P-channel MOS devices P1, P2, P3, that are connected in parallel to the drain of an N-channel device N1. A static bias signal XBIAS 701 is provided to the gate of N1. The bias generator 700 receives two bits RN0, RN1 off of the random number bus RN[7:0], which are routed through inverters 703, 702 to the gates of respective P-channel devices P4, P5. The drains of P-devices P4 and P5 are respectively coupled to the sources of P2 and P3.

In operation, the states of RN0 and RN1 are employed by the device-based variable bias generator 700 to randomly modulate the voltage of a bias signal BIAS, which is supplied to oscillators according to the present invention to establish the frequencies of their corresponding oscillatory signals. The analog level of signal XBIAS into N-channel device N1 determines the voltage division of supply voltage VDD across devices N1 and P1. Signal BIAS is the voltage present at the drain of device N1. When RN0 and RN1 are at a logic 0 state, devices P4 and P5 are turned off, thus precluding any flow of current through P-channel devices P2 and P3. When RN0 is at a logic 1 state, device P4 is switched on, thus providing a source for current to pass through device P2, consequently raising the voltage level of signal BIAS. Similarly, when RN1 is at a logic 1 state, device P5 is switched on, thus providing a source for current to pass through device P3, and having the effect of raising the voltage level of signal BIAS as well. One skilled in the art will appreciate that since P-channel devices P2 and P3 are in parallel with device P1, turning on P2 and/or P3 will resultantly increase the voltage level of BIAS in accordance with the size of P2/P3 as compared to the size of P1. One skilled will also comprehend that the size and characteristics of device N1 and devices P1–P3 can easily be adapted to provide a wide range of amplitudes for a bias signal BIAS that will satisfy the requirements of numerous applications wherein the present invention is employed for the generation of random numbers.

Figure 8:
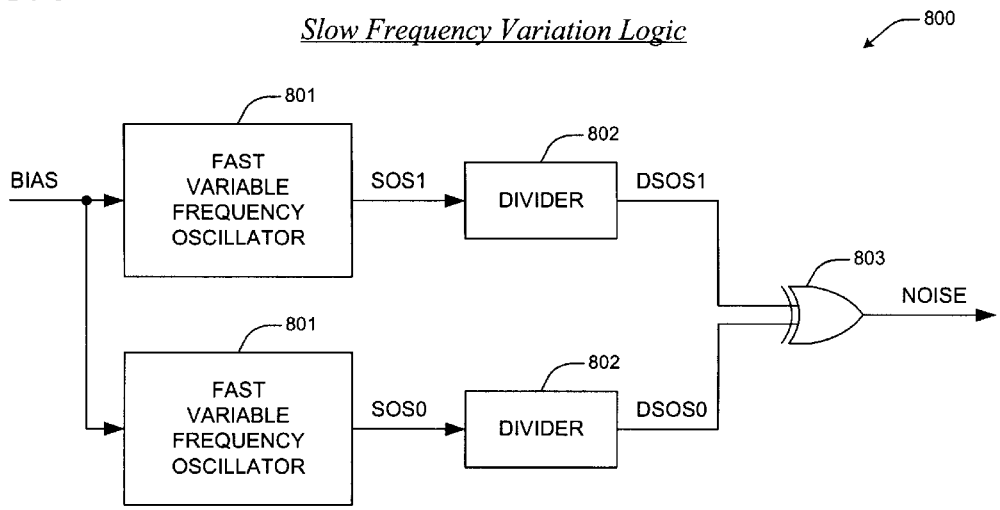
FIG. 8 is a block diagram depicting slow frequency variation logic according to the present invention.

Now referring to FIG. 8, a block diagram is presented depicting slow frequency variation logic 800 according to the present invention. Recalling the discussion with reference to FIG. 1, the slow frequency variation logic 800 (element 107 in FIG. 1) is employed to provide an additional source of randomness for varying the frequency of the slow oscillatory, or sampling, signal BOS. The frequency variation logic 800 includes two independent variable frequency oscillators 801. In one embodiment, the variable frequency oscillators 801 are identical to the random bit generation oscillator 101 discussed with reference to FIG. 1, thus providing for economy of design. The variable frequency oscillators 801 provide asynchronous oscillatory output signals SOS0, SOS1, which are supplied to frequency divider logic elements 802. Outputs DSOS0, DSOS1 from each of the dividers 802 are provided as inputs to signal compare logic 803. In one embodiment, the signal compare logic 803 is an exclusive-OR logic element 803. The signal compare logic 803 outputs a randomly varying digital noise signal NOISE, which is supplied to the slow variable frequency oscillator 102.

Generation of the randomly varying digital noise signal NOISE is accomplished by comparing the logic states of two independent and asynchronous oscillatory signals DSOS0, DSOS1. One embodiment of the present invention comprehends an exclusive-OR logic comparison performed by the signal compare logic 803, wherein, if the logic states of signals DSOS0 and DSOS1 are the same (i.e., both signals logic 0 or logic 1), then signal NOISE is not asserted (i.e., a logic 0). If the logic states of signals DSOS0 and DSOS1 are different (i.e., one of the signals is a logic 0 and the other signal is a logic 1), then signal NOISE is asserted (i.e., a logic 1). The exclusive-OR comparison performed by the signal compare logic 803 is also known as taking the parity of DSOS0 and DSOS1. When the signals DSOS0, DSOS1 have odd parity (i.e., they are different logic states), then NOISE is set to logic 1. When the signals DSOS0, DSOS1 have even parity (i.e., they have the same logic states), then NOISE is set to logic 0. In the embodiment illustrated by FIG. 8, each of the two oscillatory signals DSOS0, DSOS1 is generated by dividing the output SOS0, SOS1 of a variable frequency oscillator 801. In one embodiment, the dividers 802 are divide-by-eight dividers. The dividers 802 are employed in embodiments having oscillators 801 that are different in system response from the slow oscillator 102 to enable generation of a digital noise signal NOISE that is commensurate with the system response of the slow oscillator 102. In view of this point, one skilled in the art will appreciate that dividers 802 are not required in embodiments that employ independent oscillators 801 that comport with the system response of the sampling clock oscillator 102. One skilled will also appreciate that, since each of the oscillators 801 run independently, either odd parity or even parity (i.e., the complement of odd parity) logic functions can be employed to generate the digital noise signal NOISE. One skilled will furthermore appreciate that the oscillators 801 need not be identical.

Figure 9:
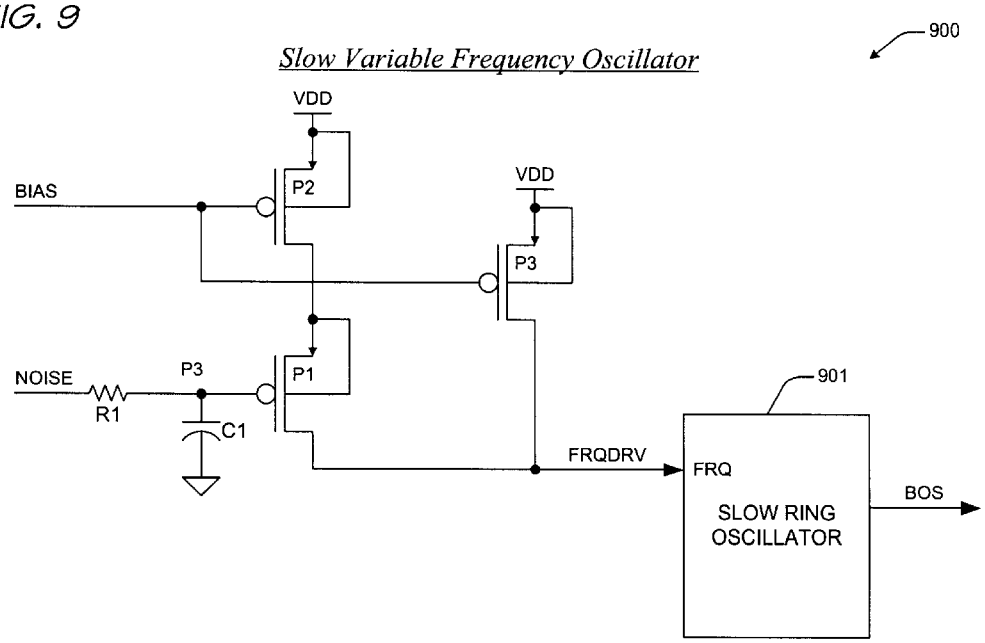
FIG. 9 is a block diagram portraying a slow variable frequency oscillator according to the present invention.

Turning now to FIG. 9, a block diagram is presented portraying a slow variable frequency oscillator according to the present invention. The slow variable frequency oscillator 900 provides the sampling clock BOS that is varied both as a function of a randomly varying analog bias signal BIAS and a randomly varying digital noise bit NOISE. The slow variable frequency oscillator 900 includes a slow ring oscillator 901 that generates a slow oscillatory signal BOS within a frequency range whose specific frequency varies according to the value of a supplied analog signal FRQDRV. To generate FRQDRV, the slow oscillator 900 has two cascaded P-channel devices P1, P2 which are connected in parallel with another P-channel device P3. The amplitude of the analog signal FRQDRV is determined by the extent to which devices P1–P3 are turned on.

Recalling from the earlier discussion with reference to FIGS. 1, 6, and 7, signal BIAS is a randomly varying analog voltage that varies about a fixed bias point, thus providing a reference whereby devices P2 and P3 are on to the extent that an acceptable amplitude is supplied by the analog signal FRQDRV to the ring oscillator 901. Furthermore, recall from the discussion with reference to FIGS. 1 and 8, that digital signal NOISE randomly changes logic states. NOISE is connected to the gate of P1 through a low-pass filter configured via a resistor R1 and capacitor C1. One skilled in the art will appreciate that certain embodiments of the present invention can employ alternative elements to achieve the resistive and capacitive effects provided by elements R1 and C1 as illustrated in FIG. 9. For example, in an integrated circuit embodiment, MOS devices may be employed to provide the functions of R1 and C1. The low-pass filter R1, C1 is employed to provide a slew to logic transitions of NOISE. Thus, transitions of signal NOISE function to randomly raise and lower the amplitude of FRQDRV within the range acceptable to the ring oscillator 901 by varying the current through P1. One skilled in the art will appreciate that since cascaded P-channel devices P1 and P2 are in parallel with device P3, the degree to which current flows through P1 will resultantly determine the amplitude of FRQDRV based on the sizes of P1–P3. One skilled will also comprehend that the size and characteristics of devices P1–P3 can easily be modified to provide a wide range of amplitudes that will comport with the requirements of numerous ring oscillators 901 employed within the scope of the present invention for generation of random numbers.

Having now discussed elements of the present invention that provide for the generation of random numbers through randomly varying the frequencies of independently generated and asynchronous oscillatory signals SOS2, BOS, details of a specific 1.5-volt CMOS microcircuit embodiment will now be discussed with reference to FIGS. 10 and 11.

Referring to FIG. 10, a table 1000 is presented showing periods (SOS_PERIOD) and frequencies (SOS_FREQUENCY) for an exemplary fast oscillatory signal SOS_ as a function of several levels of an analog bias signal BIAS. The fast oscillatory signal SOS_ refers to the random bit generation signal SOS2 and the asynchronous oscillatory signals SOS0, SOS1 which are employed to generate the random noise bit NOISE. Such signals are supplied according to the present invention by the fast variable frequency oscillator 101 and like fast oscillators 801 within the slow frequency variation logic 800. The logic states of a fixed-bias signal XRAY[2:0] are used by a variable bias generator 108, 600, 700 according to the present invention to set the value of BIAS, as has been previously discussed with reference to FIGS. 1, 6, and 7.

For the exemplary embodiment featured in FIG. 10, a BIAS voltage ranging from 766 mV to 509 mV is employed by the fast oscillators 101, 801 to produce oscillatory signals SOS2, SOS0, SOS1 ranging in frequency from approximately 500 MHz to 870 MHz. Recall from the discussions with reference to FIGS. 1, 6, and 7, that the level of signal BIAS randomly varied within the extremes depicted in the table 1000 as a plurality of bits of the random number change state on the random number bus RN[7:0].

Now referring to FIG. 11, a table 1100 is presented showing periods (BOS PERIOD) and frequencies (BOS FREQUENCY) for an exemplary slow oscillatory signal BOS as a function of several levels of an analog bias signal BIAS as affected by different logic states of a randomly varying digital noise bit NOISE. The slow oscillatory signal BOS refers to the sampling clock signal BOS supplied according to the present invention by the slow variable frequency oscillator 102. The logic states of a fixed-bias signal XRAY[2:0] are used by a variable bias generator 108, 600, 700 according to the present invention to set the value of BIAS, as has been previously discussed with reference to FIGS. 1, 6, and 7.

For the exemplary embodiment featured in FIG. 11, a BIAS voltage ranging from 766 mV to 509 mV is employed by the sampling oscillator 102 to produce a sampling clock BOS ranging in frequency from approximately 22 MHz to 63 MHz. Recall from the discussions with reference to FIGS. 1, 6, and 7, that the level of signal BIAS randomly varies within the extremes depicted in the table 1100 as a plurality of bits of the random number change state on the random number bus RN[7:0]. The discussion referring to FIG. 8 describes how the digital noise bit NOISE is generated to provide for further random variation of the sampling clock frequency.

The examples discussed with reference to FIGS. 10–11 are presented for exemplary purposes only in order to provide a context of understanding for the present invention. One skilled in the art will, however, appreciate that the context discussed with reference to FIGS. 10–11 in no way constrains the scope of the present invention to applications implied as a result of bias voltages and corresponding frequencies derived therefrom.

Although the present invention and its objects, features, and advantages have been described in detail, other embodiments are encompassed by the invention as well. For example, although the present invention is presented in the context of a random number generator for use within an integrated circuit such as a microprocessor, the scope of the present invention extends beyond such a presentation. It is anticipated that the present invention comprehends applications and embodiments wherein elements discussed herein are embodied as stand-alone devices or as separate circuits partitioned between devices.

In addition, although the oscillators described herein have been representatively exemplified as ring oscillators, use of other oscillator technologies is not precluded. Ring oscillator technologies are commonly employed within today's microelectronics for the generation of clock signals, but it should not be perceived that these devices represent the only means for embodiment of the oscillators described herein. Indeed, the scope of the present invention extends to any means or methods whereby asynchronous oscillatory signals can be independently generated and whose frequencies can be varied and employed within the constraints described above.

Furthermore, the present invention has been presented in the context of a fast bit generation oscillatory signal ranging from roughly 500 MHz to 1 GHz and a sampling oscillatory signal ranging from approximately 20 MHz to 65 MHz. Such embodiments only lend to teach the invention within a known application area. However, one skilled in the art will appreciate that the frequency ranges of elements within the present invention can be extended-up or down-to provide for the generation of random numbers at rates commensurate with the requirements of applications other than those discussed herein. Utilization of the parity between two independently generated and asynchronous oscillatory signals to generate a digital noise bit that is use to further vary the sampling clock for the random number generator allows a designer a wider range of achievable frequencies that those achievable within random number generators that utilize variation techniques such as thermal noise from a resistor.

Those skilled in the art should appreciate that they can readily use the disclosed conception and specific embodiments as a basis for designing or modifying other structures for carrying out the same purposes of the present invention, and that various changes, substitutions and alterations can be made herein without departing from the spirit and scope of the invention as defined by the appended claims.

What is claimed is:

1. A frequency variation apparatus in a random number generator, comprising:

frequency variation logic, configured to produce a noise signal that corresponds to a logical comparison of two independent and asynchronous oscillatory signals; and a slow variable frequency oscillator, coupled to said frequency variation logic, configured to receive said noise signal, and configured to vary a sampling frequency within the random number generator in accordance with said noise signal.

2. The frequency variation apparatus as recited in claim 1, wherein said slow variable frequency oscillator serially generates potential bits for use in a multiple-bit random number by taking samples of a fast oscillatory signal at said sampling frequency.

3. The frequency variation apparatus as recited in claim 1, wherein said sampling frequency is varied to enhance randomness of said potential bits.

4. The frequency variation apparatus as recited in claim 1, wherein said logical comparison of said two independent and asynchronous oscillatory signals comprises an exclusive-OR logical comparison.

5. The frequency variation apparatus as recited in claim 1, wherein one logic state of said noise signal directs said slow variable frequency oscillator to vary said sampling frequency to a minimum sampling frequency, and wherein an alternative logic state of said noise signal directs said slow variable frequency oscillator to vary said sampling frequency to a maximum sampling frequency.

6. The frequency variation apparatus as recited in claim 5, wherein said minimum sampling frequency and said maximum sampling frequency are determined according to an analog bias signal supplied to said slow variable frequency oscillator from an external source.

7. The frequency variation apparatus as recited in claim 6, wherein said analog bias signal is a randomly varying signal.

8. The frequency variation apparatus as recited in claim 5, wherein said slow variable frequency oscillator comprises:

a low-pass filter, configured to change a first slew of said noise signal, resulting in a corresponding change in a second slew of said sampling frequency.

9. The frequency variation apparatus as recited in claim 1, wherein said frequency variation logic comprises:

two ring oscillators, configured to generate said two independent and asynchronous oscillatory signals.

10. The frequency variation apparatus as recited in claim 1, wherein said frequency variation logic comprises:

first and second oscillators, for generating a first clock signal and a second clock signal;

a first divider, for receiving said first clock signal and for reducing a first frequency of said first clock signal, wherein a first output of said first divider comprises a first one of said two independent and asynchronous oscillatory signals; and second divider, for receiving said second clock signal, and for reducing a second frequency of said second clock signal, wherein a second output of said second divider comprises a second one of said two independent and asynchronous oscillatory signals.

11. The frequency variation apparatus as recited in claim 1, wherein said frequency variation logic comprises:

parity logic, for evaluating said parity, wherein an output of said parity logic provides said noise signal.

12. The frequency variation apparatus as recited in claim 11, wherein said parity logic comprises an exclusive-OR logic element.

13. A random number generation apparatus for use within an integrated circuit, comprising:

a fast oscillator, configured to generate a fast oscillatory signal at a first frequency;

a slow oscillator, configured to generate a slow oscillatory signal at a second frequency, wherein said slow oscillatory signal is employed to take samples of said fast oscillatory signal to produce bits for a random number, and wherein said slow oscillator varies said second frequency according to a noise signal; and frequency variation logic, coupled to said slow oscillator, configured to generate said noise signal, wherein said noise signal varies according to an exclusive-OR logical comparison of two independent oscillatory signals.

14. The random number generation apparatus as recited in claim 13, wherein a first state of said noise signal directs said slow oscillator to vary said second frequency to a minimum second frequency, and wherein an alternative state of said noise signal directs said slow oscillator to vary said second frequency to a maximum second frequency.

15. The random number generation apparatus as recited in claim 14, wherein said minimum second frequency and said maximum second frequency are set in accordance with a bias signal provided to said slow oscillator.

16. The random number generation apparatus as recited in claim 13, wherein said slow oscillator comprises:

a low-pass filter, configured to modify said noise signal, whereby said second frequency is varied at a rate that is slower than a noise signal slew rate.

17. The random number generation apparatus as recited in claim 13, wherein said frequency variation logic comprises:

first and second ring oscillators, configured to generate said two independent oscillatory signals.

18. The random number generation apparatus as recited in claim 13, wherein said frequency variation logic comprises:

first and second oscillators, for generating a first clock signal and a second clock signal;

a first divider, for receiving said first clock signal, and for dividing a first frequency of said first clock signal, wherein a first output of said first divider comprises a first one of said two independent oscillatory signals; and a second divider, for receiving said second clock signal, and for dividing a second frequency of said second clock signal, wherein a second output of said second divider comprises a second one of said two independent oscillatory signals.

19. The random number generation apparatus as recited in claim 13, wherein said frequency variation logic comprises:

parity logic, for performing said exclusive-OR logical comparison, wherein an output of said parity logic comprises said noise signal.

20. A bit generation mechanism, for use in a random number generator, the bit generation mechanism comprising:

a first oscillatory signal, generated by a first oscillator, and configured to oscillate at a first frequency;

a second oscillatory signal, generated by a second oscillator, and configured to oscillate at a second frequency, wherein said second frequency varies according to a noise signal;

synchronization logic, coupled to said first and second oscillatory signals, configured to serially generate bits for a random number at a rate proportional to said second frequency; and third and fourth oscillatory signals, configured to independently oscillate at third and fourth frequencies; and parity logic, coupled to said third and fourth oscillatory signals, for generating said noise signal based upon an exclusive-OR logical comparison of logic states corresponding to said third and fourth oscillatory signals.

21. The bit generation mechanism as recited in claim 20, wherein said noise signal directs said second oscillator to vary said second frequency between a minimum frequency and a maximum frequency, wherein said minimum and maximum frequencies are determined by the value of an analog bias signal.

22. The bit generation mechanism as recited in claim 20, wherein said slow oscillator comprises:

a low-pass filter, configured to alter said noise signal, thereby causing said second frequency to vary varied at a second rate that is slower than a first rate at which said noise signal varies.

23. The bit generation mechanism as recited in claim 20, further comprising:

first and second ring oscillators, configured to generate said third and fourth oscillatory signals.

24. The bit generation mechanism as recited in claim 20, further comprising:

first and second oscillators, for generating a first clock signal and a second clock signal;

a first divider, for receiving said first clock signal and for dividing a first frequency of said first clock signal to yield said third oscillatory signal; and a second divider, for receiving said second clock signal, and for dividing a second frequency of said second clock signal to yield said fourth oscillatory signal.

25. The bit generation mechanism as recited in claim 20, wherein said parity logic comprises an exclusive-OR logic element.

* * * * *